United States Patent
Okubo

(10) Patent No.: US 11,129,300 B2
(45) Date of Patent: Sep. 21, 2021

(54) MODULE AND POWER CONVERSION DEVICE

(71) Applicant: SHINDENGEN ELECTRIC MANUFACTURING CO., LTD., Chiyoda-ku (JP)

(72) Inventor: Teiichi Okubo, Hanno (JP)

(73) Assignee: SHINDENGEN ELECTRIC MANUFACTURING CO., LTD., Chiyoda-ku (JP)

(*) Notice: Subject to any disclaimer, the term of this patent is extended or adjusted under 35 U.S.C. 154(b) by 611 days.

(21) Appl. No.: 15/776,958

(22) PCT Filed: Oct. 10, 2017

(86) PCT No.: PCT/JP2017/036575
§ 371 (c)(1),
(2) Date: May 17, 2018

(87) PCT Pub. No.: WO2019/073505
PCT Pub. Date: Apr. 18, 2019

(65) Prior Publication Data
US 2019/0274229 A1    Sep. 5, 2019

(51) Int. Cl.
*H05K 7/20*      (2006.01)
*H02M 7/00*     (2006.01)
(Continued)

(52) U.S. Cl.
CPC ........... *H05K 7/2039* (2013.01); *H01L 23/02* (2013.01); *H01L 23/28* (2013.01); *H01L 25/07* (2013.01);
(Continued)

(58) Field of Classification Search
CPC .... H05K 7/2039; H05K 7/1432; H05K 7/209; H05K 7/1427; H01L 23/28
(Continued)

(56) References Cited

U.S. PATENT DOCUMENTS 5,519,252 A * 5/1996 Soyano ............... H01L 21/56
257/177
5,920,119 A    7/1999 Tamba et al.
(Continued)

FOREIGN PATENT DOCUMENTS

DE    11 2007 002 446 T5    9/2009
EP          0 791 961 A2      8/1997
(Continued)

OTHER PUBLICATIONS

Netherlands Search Report dated Jan. 10, 2019 in Netherlands Application No. 2021196 (with partial English translation), 13 pages.

(Continued)

*Primary Examiner* — Sherman Ng
(74) *Attorney, Agent, or Firm* — Oblon, McClelland, Maier & Neustadt, L.L.P.

(57) ABSTRACT

A module includes a heat dissipating substrate including a first surface and a second surface on an opposite side of the first surface, an element arranged on the first surface of the heat dissipating substrate, a connecting terminal arranged on the first surface of the heat dissipating substrate and provided for electrically connecting the element to a wiring substrate arranged on the module, a module case arranged on the first surface in such a manner that a circumference of the heat dissipating substrate is partially covered, and a sealing member sealing the element and a connecting portion of the connecting terminal with the element, wherein the heat dissipating substrate includes a positioning part for positioning the module with respect to the housing case, and the positioning part protrudes to an outer side of the module case.

7 Claims, 9 Drawing Sheets

(51) Int. Cl.
  *H05K 1/11* (2006.01)
  *H05K 1/18* (2006.01)
  *H05K 7/14* (2006.01)
  *H01L 23/28* (2006.01)
  *H01L 25/07* (2006.01)
  *H01L 23/02* (2006.01)
  *H01L 25/18* (2006.01)

(52) U.S. Cl.
  CPC ............ *H01L 25/18* (2013.01); *H02M 7/003* (2013.01); *H05K 1/115* (2013.01); *H05K 1/181* (2013.01); *H05K 7/1427* (2013.01); *H05K 7/1432* (2013.01); *H05K 7/209* (2013.01)

(58) Field of Classification Search
  USPC ......................................................... 361/707
  See application file for complete search history.

(56) References Cited

U.S. PATENT DOCUMENTS

| | | | | |
|---|---|---|---|---|
| 6,320,776 B1* | 11/2001 | Kajiura | ................. | H02M 7/003 361/709 |
| 7,952,879 B1* | 5/2011 | Vinciarelli | ............. | H05K 7/209 361/704 |
| 2004/0140116 A1* | 7/2004 | Bayerer | ................ | H01L 23/295 174/524 |
| 2008/0158824 A1 | 7/2008 | Aoki et al. | | |
| 2010/0091464 A1* | 4/2010 | Ohnishi | .............. | H01L 23/3735 361/723 |
| 2011/0069458 A1* | 3/2011 | Nakao | ................... | H01L 25/072 361/728 |
| 2011/0089568 A1 | 4/2011 | Nishibori et al. | | |
| 2014/0197532 A1* | 7/2014 | Ide | .......... | H01L 23/36 257/706 |
| 2015/0116945 A1 | 4/2015 | Minamio | | |
| 2016/0315038 A1* | 10/2016 | Sato | ...................... | H01L 23/367 |
| 2016/0336252 A1* | 11/2016 | Houzouji | ............. | H01L 25/115 |
| 2017/0149223 A1* | 5/2017 | Sasaki | ................ | H01R 13/6658 |

FOREIGN PATENT DOCUMENTS

| | | |
|---|---|---|
| EP | 0 791 961 A3 | 8/1997 |
| EP | 2 854 174 A1 | 4/2015 |
| JP | 2003-102200 A | 4/2003 |
| JP | 2007-220722 A | 8/2007 |
| JP | 2011-86768 A | 4/2011 |
| JP | 2013-16684 A | 1/2013 |
| JP | 2017-60290 A | 3/2017 |

OTHER PUBLICATIONS

International Search Report dated Jan. 9, 2018, in PCT/JP2017/036575 filed Oct. 10, 2017, (with English translation of categories of cited documents).

English translation of the International Preliminary Report on Patentability dated Apr. 23, 2020 in PCT/JP2017/036575 filed Oct. 10, 2017, 5 pages.

* cited by examiner

MODULE AND POWER CONVERSION DEVICE

FIELD

The present invention relates to a module and a power conversion device.

BACKGROUND

Conventionally, there has been an inverter-type electric-power generator used for a mobile power generator or the like that generates an alternating voltage in an alternator connected to an engine as the engine is driven, that converts the generated alternating voltage to a direct voltage through rectification by a rectifier circuit and smoothing by a smoothing capacitor, and that converts the converted direct voltage to an alternating voltage with a module (see, for example, Japanese Patent Application Laid-open No. 2003-102200).

In such inverter-type electric-power generators, respective electronic components are housed and sealed with resin in a housing case together with a wiring substrate, in a state of being electrically connected to the wiring substrate having a control circuit mounted thereon, via a connecting terminal or solder.

Among the respective electronic components, a module is configured by covering with a module case the circumference of a heat dissipating substrate arranged with an element, a wire, and a connecting terminal, and sealing with resin the element, the wire, and the connecting terminal. Upon housing the module in the housing case, the positional accuracy of the connecting terminal electrically connecting the element and the wiring substrate is particularly desired, in terms of appropriately making electrical connection of the element and the wiring substrate.

However, in a case of covering the circumference (a side surface) of the heat dissipating substrate with the module case over the entire circumference, a reference for positioning the module is set not at the side surface of the heat dissipating substrate arranged with the connecting terminal for which the positional accuracy is desired, but at the side surface of the module case. In this case, there is a problem that improving the positional accuracy of the connecting terminal is difficult.

Japanese Patent Application Laid-open No. 2017-60290 discloses a power semiconductor module mounted on a power conversion device. The power semiconductor module is a technology completely different from the present invention, because the side surface is covered with resin over the entire circumference, and the module itself does not include a heat dissipating substrate.

SUMMARY

Technical Problem

Therefore, an object of the present invention is to provide a module and a power conversion device capable of improving the positional accuracy of a connecting terminal.

Solution to Problem

A module according to an aspect of the present invention is a module housed in a housing case of an electronic component in a power conversion device, the module comprising:

a heat dissipating substrate comprising a first surface and a second surface on an opposite side of the first surface;

an element arranged on the first surface of the heat dissipating substrate;

a connecting terminal arranged on the first surface of the heat dissipating substrate and provided for electrically connecting the element to a wiring substrate arranged on the module;

a module case arranged on the first surface in such a manner that a circumference of the heat dissipating substrate is partially covered; and a sealing member sealing the element and a connecting portion of the connecting terminal with the element, wherein the heat dissipating substrate comprises a positioning part for positioning the module with respect to the housing case, and the positioning part protrudes to an outer side of the module case.

In the module, the positioning part can be at least one corner portion of the heat dissipating substrate.

In the module, the positioning part can be at least a pair of corner portions located on a diagonal line of the heat dissipating substrate.

In the module, the module case can include a first side wall portion arranged on the first surface on an inner side of the corner portion and provided with a cutout causing the corner portion to protrude, and a second side wall portion arranged on a periphery of the first surface in such a manner that a circumference of the heat dissipating substrate excluding the corner portion is covered.

In the module, the module case can be adhered onto the first surface via an adhesive, and the module case can comprise a flow-direction regulating part regulating a flow direction of the adhesive in such a manner that the adhesive flows toward an inner side of the module case.

In the module, the flow-direction regulating part can be an inner periphery of an adhesion surface of the module case for the first surface, being located farther in a surface normal direction from the first surface than an outer periphery.

In the module, the pair of corner portions can have a shape mutually different from each other.

In the module, the pair of corner portions can be mutually different from each other in an amount of chamfer.

In the module, a difference of a coefficient of thermal expansion of the sealing member and a coefficient of thermal expansion of the heat dissipating substrate can be equal to or less than a threshold.

In the module, the second side wall portion of the module case can be provided with a second cutout causing a side surface of the heat dissipating substrate to be partially exposed.

A power conversion device according to an aspect of the present invention is a power conversion device comprising: a housing case of an electronic component; a module housed in the housing case; and a wiring substrate arranged on the module in the housing case, wherein the module comprises a heat dissipating substrate comprising a first surface and a second surface on an opposite side of the first surface, an element arranged on the first surface of the heat dissipating substrate, a connecting terminal arranged on the first surface of the heat dissipating substrate and provided for electrically connecting the element to the heat dissipating substrate, a module case arranged on the first surface in such a manner that a circumference of the heat dissipating substrate is partially covered, and a sealing member sealing the element and a connecting portion of the connecting terminal with the element, the heat dissipating substrate comprises a positioning part for positioning the module with respect to the housing case, and the positioning part protrudes to an outer side of the module case.

In the power conversion device, a thermal conductivity of the heat dissipating substrate can be greater than a thermal conductivity of the housing case.

In the power conversion device, the second surface of the heat dissipating substrate can be in contact with a region in the housing case in which the module is arranged.

In the power conversion device, the wiring substrate can comprise a third surface opposing the first surface of the housing case and a fourth surface on an opposite side of the third surface, the wiring substrate can be provided with a through hole passing through from the third surface to the fourth surface, and the connecting terminal can be connected to the wiring substrate in a state of being inserted to the through hole.

In the power conversion device, a region in which the module is arranged can be a recessed portion having a side wall surrounding the heat dissipating substrate.

Effect of the Invention

A module according to an aspect of the present invention is a module housed in a housing case of an electronic component in a power conversion device, the module including a heat dissipating substrate including a first surface and a second surface on an opposite side of the first surface, an element arranged on the first surface of the heat dissipating substrate, a connecting terminal arranged on the first surface of the heat dissipating substrate and provided for electrically connecting the element to a wiring substrate arranged on the module, a module case arranged on the first surface in such a manner that a circumference of the heat dissipating substrate is partially covered, and a sealing member sealing the element and a connecting portion of the connecting terminal with the element, where the heat dissipating substrate includes a positioning part for positioning the module with respect to the housing case, and the positioning part protrudes to an outer side of the module case.

In this manner, according to the present invention, positioning of the module with respect to the housing case can be performed with the reference being a protruding positioning part, by causing the positioning part of the heat dissipating substrate to protrude to the outer side of the module case. Therefore, the positional accuracy of the connecting terminal arranged on the heat dissipating substrate can be improved.

Therefore, according to the present invention, the positional accuracy of the connecting terminal is improved.

DESCRIPTION OF EMBODIMENTS

Figure 1:
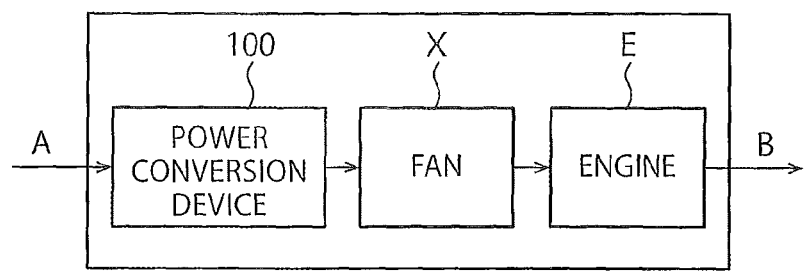
FIG. 1 is a diagram illustrating an example of a configuration of an electric-power generating system 1000 to which a power conversion device 100 according to a first embodiment is applied.

Embodiments of the present invention will be described below in detail with reference to the accompanying drawings. The following embodiments do not limit the present invention. In the drawings referred to in the following embodiments, the same portions or portions having mutually identical functions are denoted by like or similar reference characters, and redundant explanations thereof will be omitted.

First Embodiment

First, with reference to FIG. 1 to FIG. 10, a module and a power conversion device according to a first embodiment are described.

Figure 2:
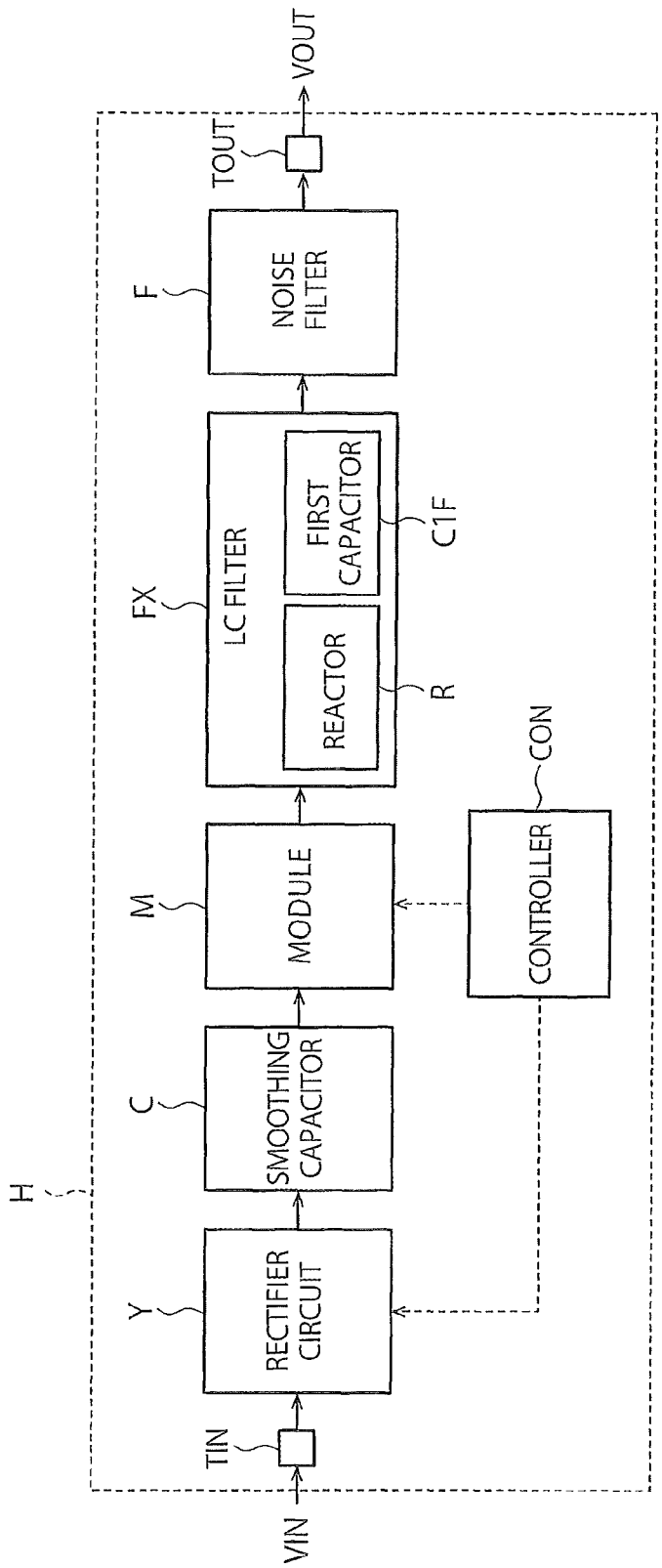
FIG. 2 is a block diagram illustrating an example of a main configuration of the power conversion device 100 according to the first embodiment illustrated in FIG. 1.
Figure 3:
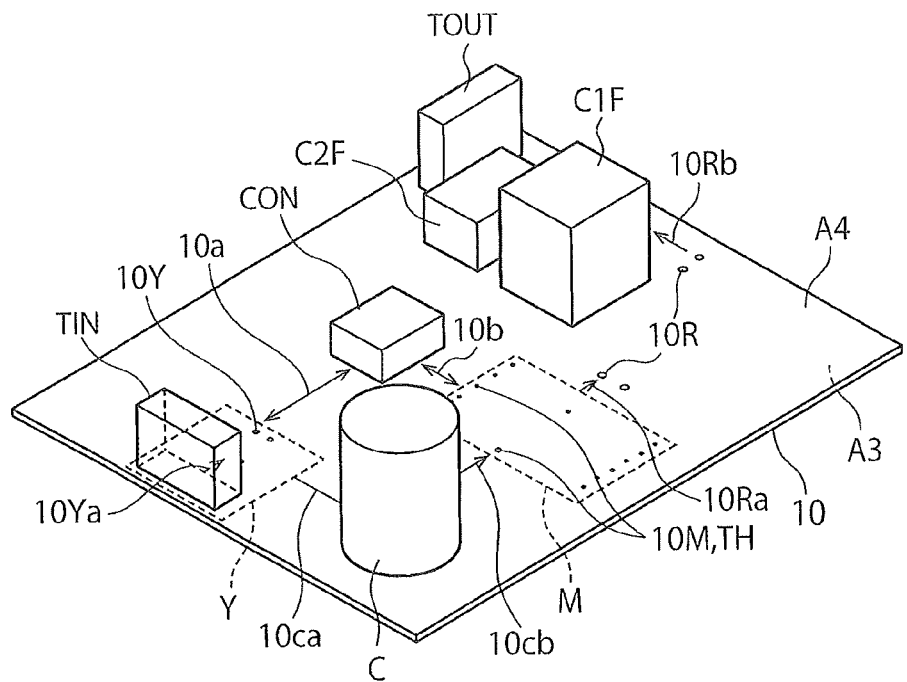
FIG. 3 is a perspective view of a wiring substrate 10 of the power conversion device 100 illustrated in FIG. 1 and an electronic component on the wiring substrate 10.
Figure 4:
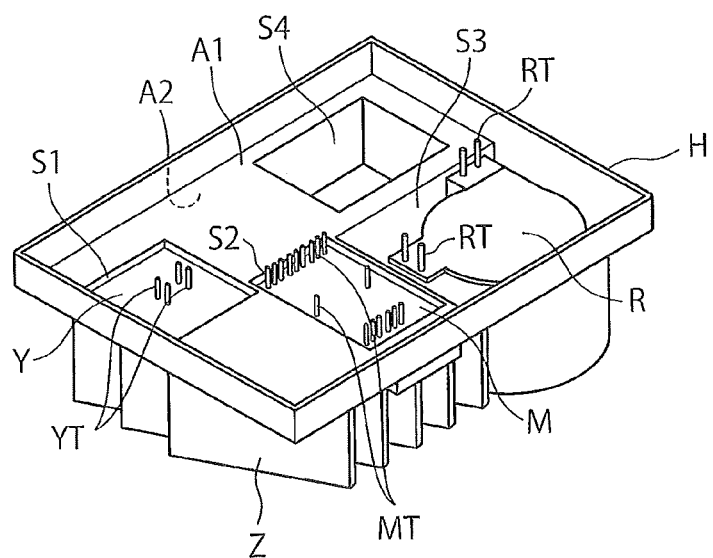
FIG. 4 is a perspective view of a housing case H of the power conversion device 100 illustrated in FIG. 1 and electronic components Y, M, and R on the housing case H.
Figure 5:
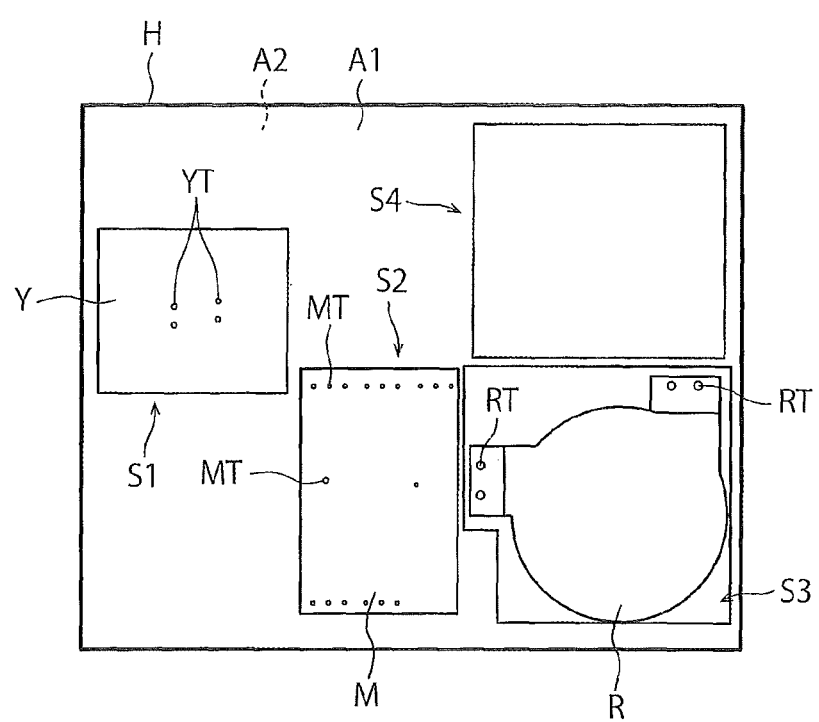
FIG. 5 is a plan view of the housing case H of the power conversion device 100 illustrated in FIG. 1 and the electronic components Y, M, and R on the housing case H.
Figure 6:
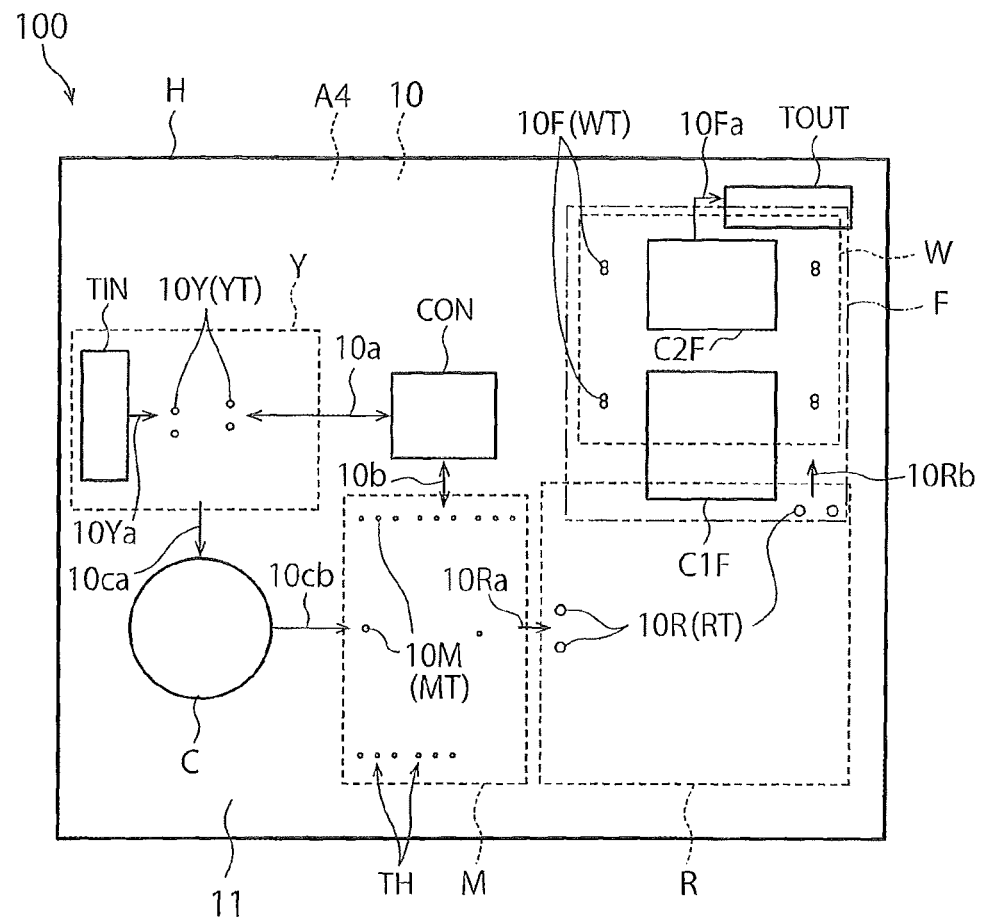
FIG. 6 is a plan view of the power conversion device 100 illustrated in FIG. 1.
Figure 7:
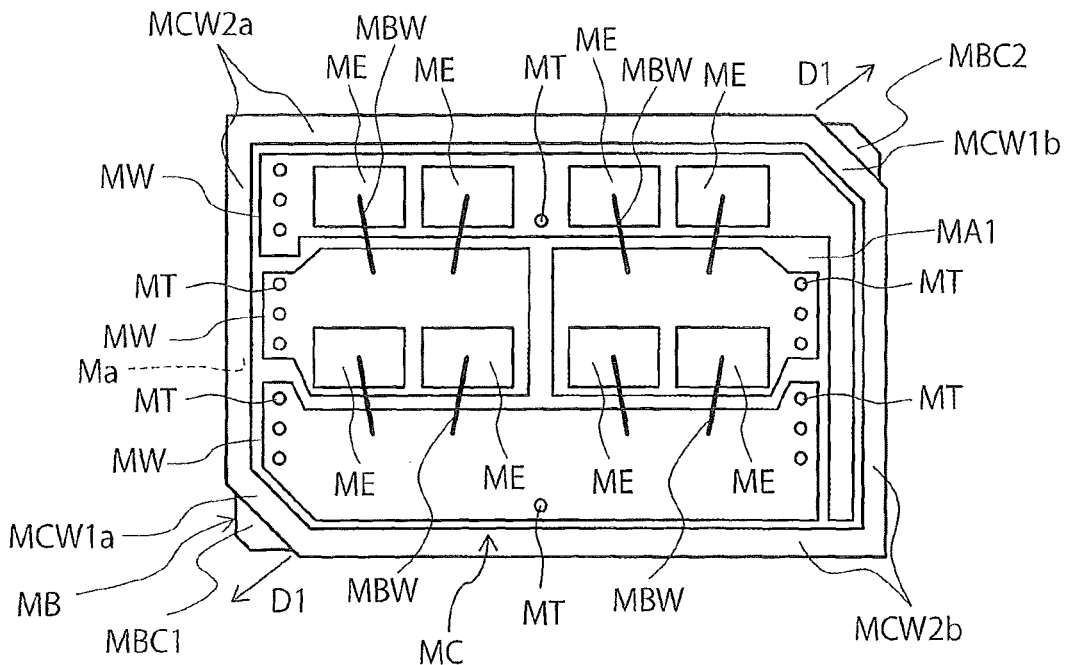
FIG. 7 is a plan view of connecting terminals MT and elements ME of a module M illustrated in FIG. 2.
Figure 8:
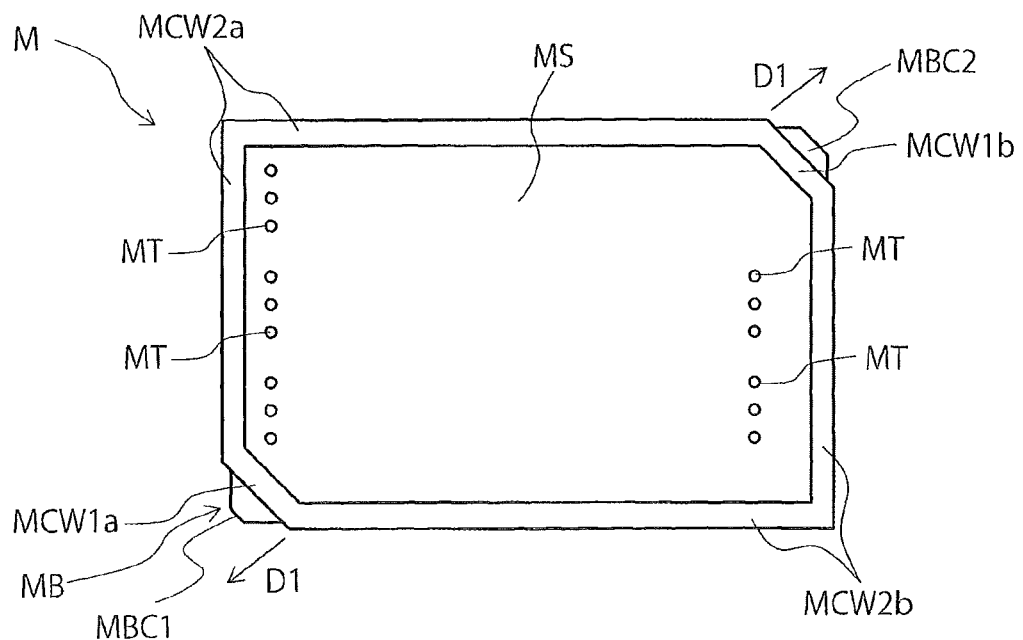
FIG. 8 is a plan view of the module M illustrated in FIG. 2.
Figure 9:
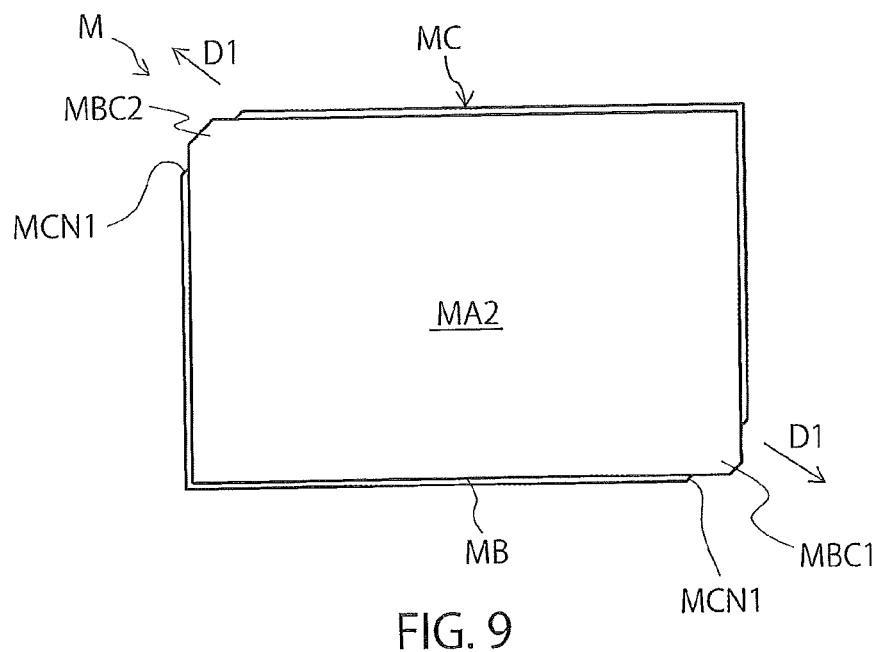
FIG. 9 is a bottom view of the module M illustrated in FIG. 2.
Figure 10:
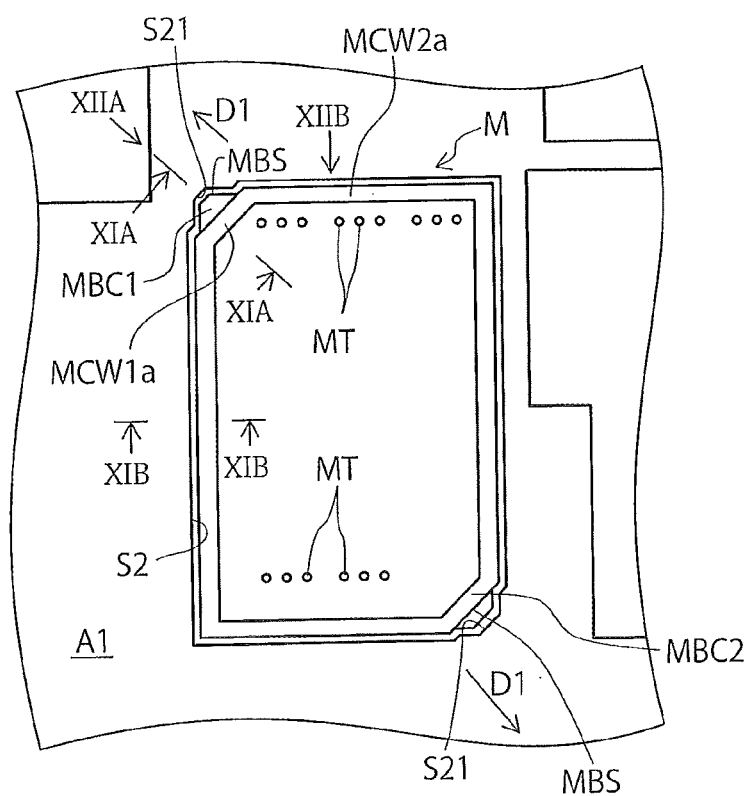
FIG. 10 is an enlarged plan view of the housing case H and the module M of the power conversion device 100 illustrated in FIG. 1.

FIG. 1 is a diagram illustrating an example of a configuration of an electric-power generating system 1000 to which a power conversion device 100 according to the first embodiment is applied. FIG. 2 is a block diagram illustrating an example of a main configuration of the power conversion device 100 according to the first embodiment illustrated in FIG. 1. FIG. 3 is a perspective view of a wiring substrate 10 of the power conversion device 100 illustrated in FIG. 1 and an electronic component on the wiring substrate 10. FIG. 4 is a perspective view of a housing case H of the power conversion device 100 illustrated in FIG. 1 and electronic components Y, M, and R on the housing case H. FIG. 5 is a plan view of the housing case H of the power conversion device 100 illustrated in FIG. 1 and the electronic components Y, M, and R on the housing case H. FIG. 6 is a plan view of the power conversion device 100 illustrated in FIG. 1. FIG. 7 is a plan view of connecting terminals MT and elements ME of the module M illustrated in FIG. 2. FIG. 8 is a plan view of the module M illustrated in FIG. 2. FIG. 9 is a bottom view of the module M illustrated in FIG. 2. FIG. 10 is an enlarged plan view of the housing case H and the module M of the power conversion device 100 illustrated in FIG. 1.

As illustrated in FIG. 1, for example, the electric-power generating system 1000 includes an engine E, a fan X driven by an alternator (not illustrated) connected to the engine E, and the power conversion device 100 that is connected to the engine E and outputs an alternating voltage (an output voltage) resulting from power conversion of an alternating voltage (an input voltage) output by the alternator.

In the electric-power generating system 1000, driving the fan X causes an airflow A from outside to flow into the electric-power generating system 1000 and the airflow A is guided to the circumference of the power conversion device 100 and the engine E. With this configuration, the power conversion device 100 and the engine E are cooled by the airflow A, and heat generated by the power conversion device 100 and the engine E is dissipated outside together with an airflow B.

As illustrated in FIG. 2 to FIG. 6, for example, the power conversion device 100 includes the housing case H, the wiring substrate 10, a first sealing member 11, an input terminal TIN, the rectifier circuit Y as an example of an electronic component, a smoothing capacitor C, the module M, an LC filter (a reactor R and a first capacitor C1F) FX, a noise filter F, an output terminal TOUT, and a controller CON. In FIG. 3 to FIG. 6, the respective electronic components Y, C, M, R, and F are schematically represented by dashed or solid rectangular frames.

As illustrated in FIG. 6, the noise filter F includes a winding component (that is, for example, a common-mode choke coil) W and a second capacitor C2F. Each of the capacitor C1F and the capacitor C2F may include a plurality of capacitors.

Details of the respective component parts of the power conversion device 100 are described below in order.

(Housing Case H)

The housing case H houses the respective component parts of the power conversion device 100. The housing case H has heat conductivity in terms of dissipating outside the heat generated by an electronic component (for example, the module M or the rectifier circuit Y) that is a heat generating source. The housing case H may be made of metal such as aluminum so as to have heat conductivity.

As illustrated in FIG. 4 and FIG. 5, the housing case H includes a first surface A1 and a second surface A2 on the opposite side of the first surface A1. The first surface A1 can be described as an upper surface or an inner surface, and the second surface A2 can be described as a lower surface or an outer surface.

As illustrated in FIG. 4, on the first surface A1 of the housing case H, a first region for arranging the rectifier circuit Y, a second region for arranging the module M, a third region for arranging the reactor R, and a fourth region for arranging the winding component W are provided.

Figure 11A:
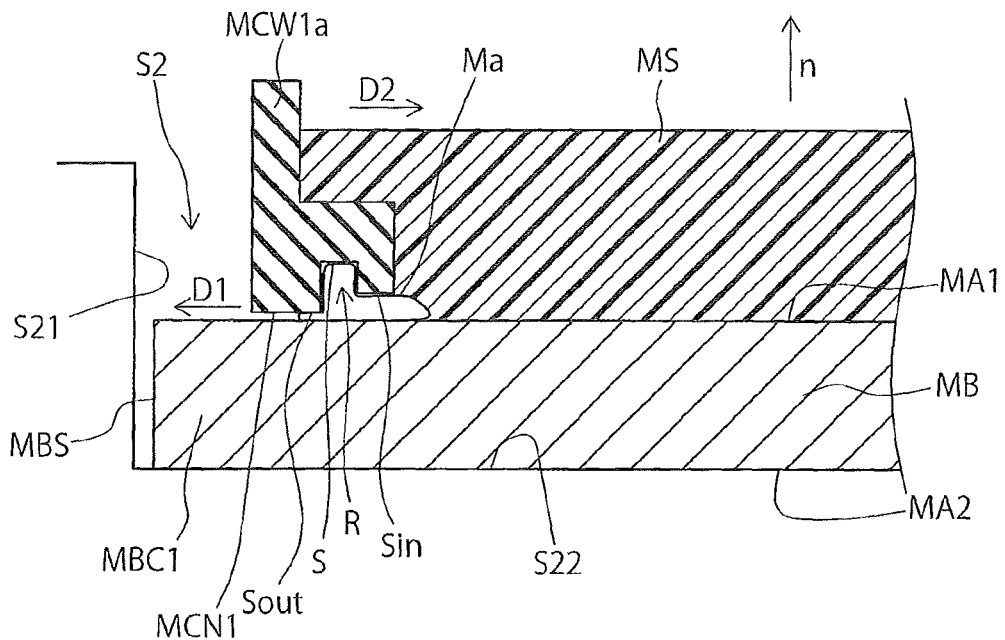
FIG. 11A is a sectional view of the power conversion device 100 according to a second embodiment taken along a cross section corresponding to an XIA-XIA cross section in FIG. 10.
Figure 11B:
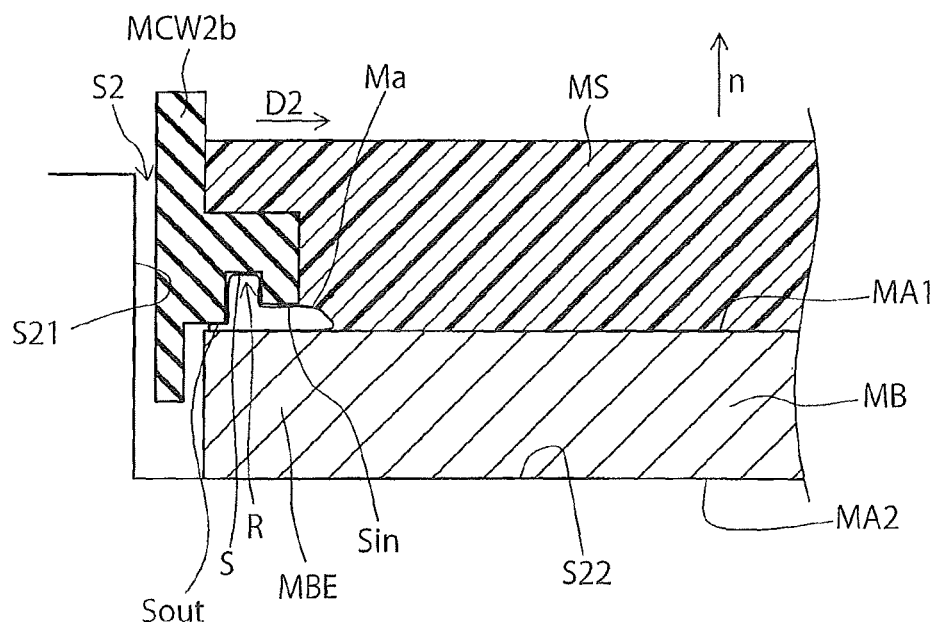
FIG. 11B is a sectional view of the power conversion device 100 according to the second embodiment taken along a cross section corresponding to an XIB-XIB cross section in FIG. 10.

Specifically, on the first surface A1, a first recessed portion S1 as an example of the first region, a second recessed portion S2 as an example of the second region, a third recessed portion S3 as an example of the third region, and a fourth recessed portion S4 as an example of the fourth region are provided to be recessed toward the second surface A2. The second recessed portion S2 is provided to be adjacent to the first recessed portion S1. As illustrated in FIG. 11A and FIG. 11B, the second recessed portion S2 includes a side wall S21 surrounding a heat dissipating substrate MB of the module M described below and an inner bottom surface S22 connected to a lower end of the side wall S21. The third recessed portion S3 is provided to be adjacent to the second recessed portion S2. The fourth recessed portion S4 is provided to be adjacent to the third recessed portion S3.

The housing case H is provided with a heat dissipating fin Z in a form of protruding from the second surface A2. By being cooled by the airflow A supplied from outside, the heat dissipating fin Z dissipates outside the heat generated by the electronic component (for example, the rectifier circuit Y and the module M) that is a heat generating source. For example, the heat dissipating fin Z can be molded integrally with the housing case H by metal mold casing such as die casting using a metal material such as aluminum.

(Wiring Substrate 10)

The wiring substrate 10 is a substrate provided with a plurality of wires 10Ya, 10ca, 10cb, 10Ra, 10Rb, 10Fa, 10a, and 10b and a plurality of electrodes 10Y, 10M, 10R, and 10F for electrical connection of a terminal and an electronic component or of electronic components of the power conversion device 100. In FIG. 3 and FIG. 6, the wires and electrodes provided on the wiring substrate 10 are represented in a simplified manner. As illustrated in FIG. 6, the wiring substrate 10 is arranged in the housing case H. As illustrated in FIG. 3, the wiring substrate 10 includes a third surface A3 opposing the first surface A1 of the housing case H and a fourth surface A4 on the opposite side of the third surface A3. The wiring substrate 10 is provided with a through hole TH passing through the wiring substrate 10 from the third surface A3 to the fourth surface A4. The terminal MT described below is connected to the wiring substrate 10 in a state of being inserted to the through hole TH.

(Electronic Component, Terminal)

The input terminal TIN is arranged on the fourth surface A4 of the wiring substrate 10. As illustrated in FIG. 3 and FIG. 6, the input terminal TIN is connected to the input of the rectifier circuit Y via the wire 10Ya of the wiring substrate 10. The input terminal TIN is supplied with an input voltage VIN.

The rectifier circuit Y, which is an example of the electronic component, is an example of a heat generating source that generates heat through operation. The rectifier circuit Y is arranged in the first recessed portion S1 on the first surface A1 of the housing case H. As illustrated in FIG. 4, the rectifier circuit Y includes a plurality of terminals YT for input and output of the input voltage VIN (see FIG. 2), a rectified voltage, or a control signal. These terminals YT are electrically connected by a solder material or the like to the electrode 10Y of the wiring substrate 10. An element of the rectifier circuit Y may be sealed (for example, sealed with resin) by a sealing member different from the first sealing member 11. In this case, the thermal conductivity of the sealing member sealing the element of the rectifier circuit Y may be greater than the thermal conductivity of a second sealing member MS of the module M described below. The rectifier circuit Y is controlled by the controller CON and rectifies and outputs the input voltage VIN.

The smoothing capacitor C is arranged on the fourth surface A4 of the wiring substrate 10. As illustrated in FIG. 3 and FIG. 6, the smoothing capacitor C is connected to the output of the rectifier circuit Y via the wire 10ca and the electrode 10Y of the wiring substrate 10. The smoothing capacitor C smooths out the voltage output by the rectifier circuit Y.

(Module M)

The module M is one of the electronic components housed in the housing case H. The module M can be also described as a semiconductor device including a semiconductor element. The module M is an example of a heat generating source that generates heat through operation. The heating value per unit time of the module M when it is operating is greater than the heating value per unit time of the rectifier circuit Y when it is operating.

As illustrated in FIG. 4, the module M is arranged in the second recessed portion S2 on the first surface A1 of the housing case H to be adjacent to the rectifier circuit Y. The module M includes a plurality of the terminals MT for input and output of a rectified voltage, an alternating voltage, or a control signal, as an example of connecting terminals for electrically connecting the elements ME described below to the wiring substrate 10. These terminals MT are electrically connected by a solder material or the like to the electrode 10M of the wiring substrate 10. As illustrated in FIG. 3 and FIG. 6, the module M is connected to the output of the smoothing capacitor C via the wire 10cb of the wiring substrate 10. The module M is controlled by the controller CON and converts and outputs a voltage smoothed out by the smoothing capacitor C (that is, a voltage rectified by the rectifier circuit Y).

In addition to the terminal MT, the module M further includes the heat dissipating substrate MB, a plurality of wires MW on the heat dissipating substrate MB, a plurality of the elements ME on the wires MW, and a plurality of bonding wires MBW on the wires MW and the elements ME. Further, the module M includes a module case MC on the heat dissipating substrate MB and the second sealing member MS on the wires MW, the elements ME, and the bonding wires MBW.

The heat dissipating substrate MB is a member having heat conductivity for dissipation of heat occurring from the element ME. As illustrated in FIG. 7 and FIG. 9, the heat dissipating substrate MB includes a first surface MA1 as an example of a first surface and a second surface MA2 as an example of a second surface on the opposite side of the first surface. The first surface MA1 is formed with an insulating layer (not illustrated). The second surface MA2 is in contact with the inner bottom surface S22 of the second recessed portion S2.

In order to ensure heat dissipation of the element ME with a greater heating value per unit time when it is operating as compared to the other electronic components Y, R, and W, the thermal conductivity of the heat dissipating substrate MB mounted with the element ME is made greater than the thermal conductivity of the housing case H. That is, the heat dissipating substrate MB has a thermal resistance smaller than the thermal resistance of the housing case H. For example, it is possible that the heat dissipating substrate MB is made of copper, while the housing case H is made of aluminum.

The heat dissipating substrate MB dissipates heat occurring from the element ME to the second recessed portion S2 of the housing case H via the second surface MA2 and the inner bottom surface S22 in contact therewith. The configuration of the heat dissipating substrate MB having a thermal resistance smaller than the thermal resistance of the housing case H is a configuration unique to the module M, among the electronic components Y, M, R, and W on the first surface A1.

The wire MW is arranged on the first surface MA1 of the heat dissipating substrate MB. The terminal M is arranged on the first surface MA1 with the wire MW therebetween.

The element ME is arranged on the first surface MA1 of the heat dissipating substrate MB with the wire MW therebetween. The heating value per unit time of the module M when it is operating due to heat generation of the element ME is greater than the heating value per unit time of the rectifier circuit Y when it is operating. The element ME is, for example, a semiconductor element, and more specifically a transistor forming an H-bridge module.

The bonding wire MBW electrically connects the wire MW and the element ME to each other.

The module case MC is arranged on the first surface MA1 to partially cover the circumference of the heat dissipating substrate MB. For example, the module case MC is made of resin such as polybutylene terephthalate resin.

The second sealing member MS seals the element ME, a connecting portion of the terminal MT with the element ME, the wire MW, and the bonding wire MBW. For example, the second sealing member MS is made of resin such as black epoxy resin.

The difference in the coefficients of thermal expansion of the second sealing member MS and the heat dissipating substrate MB is equal to or less than a threshold that is smaller than the difference in the coefficients of thermal expansion of the first sealing member 11 described below and the heat dissipating substrate MB. The thermal conductivity of the second sealing member MS can be smaller than the thermal conductivity of the first sealing member 11 described below.

For performing positioning (that is, position adjustment) of the module M with high accuracy with the reference being a side surface MBS of the heat dissipating substrate MB, the heat dissipating substrate MB includes positioning parts MBC1 and MBC2 protruding to an outer side D1 of the module case MC in a surface direction along the first surface MA1, as illustrated in FIG. 7 to FIG. 10.

By using the positioning parts MBC1 and MBC2, positioning of the module M with respect to the housing case H can be performed with high accuracy, with the reference being the side surface MBS of the positioning parts MBC1 and MBC2 as the side surface MBS of the heat dissipating substrate MB.

Specifically, the positioning parts MBC1 and MBC2 are two corner portions MBC1 and MBC2 of the heat dissipating substrate MB.

More specifically, in the examples of FIG. 7 to FIG. 10, the positioning parts MBC1 and MBC2 are a pair of the corner portions MBC1 and MBC2 located on a diagonal line of the heat dissipating substrate MB having a rectangular shape. In the following descriptions, the positioning parts MBC1 and MBC2 are also referred to as the corner portions MBC1 and MBC2.

As a specific configuration example for causing the corner portions MBC1 and MBC2 of the heat dissipating substrate MB to protrude to the outer side D1 of the module case MC, the module case MC includes a pair of first side wall portions MCW1a and MCW1b and a pair of second side wall portions MCW2a and MCW2b.

Figure 12:
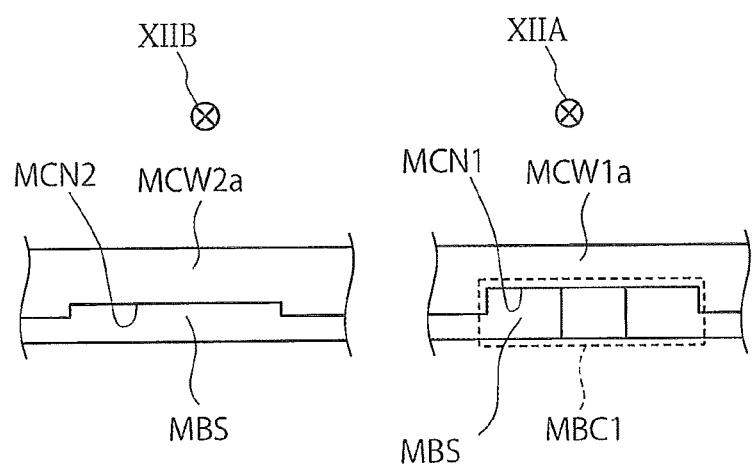
FIG. 12 is a side view of the power conversion device 100 according to a third embodiment as viewed from a direction corresponding to an XIIA direction and an XIIB direction in FIG. 10.

The pair of first side wall portions MCW1a and MCW1b of the module case MC is arranged on the first surface MA1 on the inner side of the pair of respective corner portions MBC1 and MBC2 of the heat dissipating substrate MB. The first side wall portions MCW1a and MCW1b are inclined with respect to the periphery of the heat dissipating substrate MB. As illustrated in FIG. 9 and FIG. 12 described below, the first side wall portions MCW1a and MCW1b are provided with a cutout MCN1 causing the corner portions MBC1 and MBC2 to protrude to the outer side D1 of the module case MC.

The pair of second side wall portions MCW2a and MCW2b of the module case MC is arranged on a periphery BE (see FIG. 11B) of the first surface MA1 of the heat dissipating substrate MB, in such a manner that the circumference of the heat dissipating substrate MB excluding the pair of corner portions MBC1 and MBC2 of the heat dissipating substrate MB is covered.

The module case MC is adhered onto the first surface MA1 of the heat dissipating substrate MB via an adhesive Ma. The adhesive Ma is a silicone adhesive, for example.

For prevention of the module M from being arranged in a wrong direction on the second recessed portion S2, the corner portions MBC1 and MBC2 of the heat dissipating substrate MB respectively have a shape mutually different from each other, as illustrated in FIG. 7 to FIG. 9. More specifically, the corner portions MBC1 and MBC2 differ from each other in the amount of chamfer, that is, the amount of protrusion from the module case MC. In other words, the heat dissipating substrate NIB has, about the center point in the surface direction thereof, a non-rotationally symmetric shape. While the heat dissipating substrate NIB has a non-rotationally symmetric shape, the module case MC can have a rotationally symmetric shape as illustrated in FIG. 10.

As illustrated in FIG. 10, the side walls S21 of the second recessed portion S2 facing the side surfaces MBS of the respective corner portions MBC1 and MBC2 also have a shape mutually different from each other along the shapes of the corner portions MBC1 and MBC2 that are mutually different from each other.

As illustrated in FIG. 4, the reactor R as an example of an electronic component is arranged in the third recessed portion S3 on the first surface A1 of the housing case H to be adjacent to the module M. As illustrated in FIG. 6, the reactor R includes a plurality of terminals RT for input of a voltage output by the module M and output of an adjusted voltage. These terminals RT are electrically connected by a solder material or the like to the electrode 10R of the wiring substrate 10. As illustrated in FIG. 6, the reactor R is connected to the output of the module M via the wire 10Ra and the electrode 10M of the wiring substrate 10. The reactor R adjusts and outputs a voltage output by the module M. The output (the terminal RT for output and the electrode 10R) of the reactor R is connected to the input of the noise filter F via the wire 10Rb of the wiring substrate 10 and the first capacitor C1F arranged on the fourth surface A4 of the wiring substrate 10.

A portion of the noise filter F is arranged on the third surface A3 of the wiring substrate 10, and another portion is arranged on the fourth surface A4 of the wiring substrate 10. In the examples illustrated in FIG. 3 to FIG. 6, the winding component W of the noise filter F is arranged on the third surface A3 and in the fourth recessed portion S4 on the first surface A1 of the housing case H. The second capacitor C2F of the noise filter F is arranged on the fourth surface A4. The winding component W of the noise filter F includes a plurality of terminals WT for input and output of a voltage between the capacitors C1f and C2F in the process of filtering a voltage output by the LC filter FX configured of the reactor R and the first capacitor C1F. These terminals WT are electrically connected by a solder material or the like to the electrode 10F of the wiring substrate 10. The noise filter F filters and outputs a voltage output by the LC filter FX.

The output terminal TOUT is arranged on the fourth surface A4 of the wiring substrate 10. As illustrated in FIG. 6, the output terminal TOUT is connected to the output of the noise filter F via the wire 10Fa of the wiring substrate 10. The output terminal TOUT outputs, as an output voltage VOUT, a voltage supplied from the noise filter F.

The controller CON is arranged on the fourth surface A4 of the wiring substrate 10. As illustrated in FIG. 6, the controller CON is configured to control the operation of the rectifier circuit Y through input and output of a control signal to the rectifier circuit Y via the wire 10a and the electrode 10Y. The controller CON is configured to control the operation of the module M through input and output of a control signal to the module M via the wire 10b and the electrode 10M.

(First Sealing Member 11)

The first sealing member 11 seals the rectifier circuit Y, the module M, the reactor R, and the winding component W on the first surface A1 of the housing case H.

The first sealing member 11 seals the wiring substrate 10 and the controller CON on the fourth surface A4 of the wiring substrate 10.

The first sealing member 11 seals a connecting portion for the wiring substrate 10 and each of the input terminal TIN, the smoothing capacitor C, the noise filter F, and the output terminal TOUT.

For example, the first sealing member 11 is made of resin such as epoxy resin. The resin forming the first sealing member 11 differs more greatly in the coefficient of thermal expansion from the heat dissipating substrate MB than the resin forming the second sealing member MS. The resin forming the first sealing member 11 may be greater in thermal conductivity than the resin forming the second sealing member MS.

Effects achieved in the first embodiment are described below.

As described above, the module M in the first embodiment includes the heat dissipating substrate MB, the element ME, the terminal MT, the module case MC, and the second sealing member MS, and the heat dissipating substrate MB includes the positioning parts MBC1 and MBC2 for positioning the module M with respect to the housing case H, and the positioning parts MBC1 and MBC2 protrude to the outer side of the module case MC. With such a configuration, positioning of the module M with respect to the housing case H can be performed with the reference being the side surface MBS of the positioning parts MBC1 and MBC2 protruding to the outer side of the module case MC. More specifically, the position of the module M can be adjusted in such a manner that the distance of the side surface MBS of the protruding positioning parts MBC1 and MBC2 and the side wall S21 of the second recessed portion S2 of the housing case H facing the side surface MBS becomes an appropriate distance.

Because the module case MC is a member separate from the heat dissipating substrate MB, there is inevitably a displacement corresponding to an assembly tolerance with respect to the heat dissipating substrate MB and the terminal MT on the heat dissipating substrate MB. In a case of performing positioning of the module M with respect to the housing case H with the reference being the side surface of the module case MC, the displacement of the module case MC makes it difficult to ensure the positional accuracy of the terminal MT on the heat dissipating substrate MB.

On the other hand, the positioning parts MBC1 and MBC2, which are a portion of the heat dissipating substrate MB, are naturally without any displacement from the heat dissipating substrate MB. Therefore, by performing positioning of the module M with respect to the housing case H with the reference being the side surface of the positioning parts MBC1 and MBC2, the positional accuracy of the terminal MT on the heat dissipating substrate MB can be improved.

As described above, in the first embodiment, the positioning parts MBC1 and MBC2 are the corner portions MBC1 and MBC2 of the heat dissipating substrate MB. With such a configuration, positioning can be performed in a simple manner and with high accuracy, by performing positioning of the module case MC using the corner portions MBC1 and MBC2, which are end portions of the heat dissipating substrate MB in two directions. By limiting the area of the heat dissipating substrate MB protruding from the module case MC, restrictions on the shape of the module case MC or the layout of the wire MW or the element ME inside the module case MC can be limited.

As described above, in the first embodiment, the positioning parts MBC1 and MBC2 are the pair of corner portions MBC1 and MBC2 located on the diagonal line of the heat dissipating substrate MB. With such a configuration, positioning of the module M can be performed with higher accuracy by using the pair of corner portions MBC1 and MBC2 located on the diagonal line.

As described above, in the first embodiment, the module case MC includes the first side wall portions MCW1*a* and MCW1*b* provided with the cutout MCN1 causing the corner portions MBC1 and MBC2 to protrude and the second side wall portions MCW2*a* and MCW2*b* that cover the circumference of the heat dissipating substrate MB excluding the corner portions MBC1 and MBC2. With such a configuration, the corner portions MBC1 and MBC2 of the heat dissipating substrate MB can be caused to protrude to the outer side of the module case MC with a simple shape of the module case MC.

As described above, in the first embodiment, the pair of corner portions MBC1 and MBC2 on the diagonal line of the heat dissipating substrate MB has a shape mutually different from each other. In accordance therewith, the side surfaces MBS of the second recessed portions S2 facing the pair of respective corner portions MBC1 and MBC2 also have a shape mutually different from each other. With such a configuration, the module M can be prevented from being arranged in a wrong direction with respect to the second recessed portion S2. Therefore, with the arrangement of the module M being prevented, a wrong position of the terminal MT can be recognized immediately. Accordingly, electrical connection of the module M and another electronic component can be made promptly. Because the module M can be positioned with high accuracy using the corner portions MBC1 and MBC2 and the module M being in a wrong direction can be prevented, convenience can be improved.

As described above, in the first embodiment, the pair of corner portions MBC1 and MBC2 on the diagonal line of the heat dissipating substrate MB is mutually different from each other in the amount of chamfer. With such a configuration, the module M being in a wrong direction can be prevented with a simple shape of the heat dissipating substrate MB.

As described above, in the first embodiment, the difference in the coefficients of thermal expansion of the second sealing member MS and the heat dissipating substrate MB is equal to or less than a threshold smaller than the difference in the coefficients of thermal expansion of the first sealing member 11 and the heat dissipating substrate MB.

Accordingly, the coefficient of thermal expansion of the second sealing member MS sealing the mounted components MBW, ME, MT, and MW on the heat dissipating substrate MB can be made close to the coefficient of thermal expansion of the heat dissipating substrate MB. Therefore, an increase in the relative amount of thermal expansion of the second sealing member MS with respect to the heat dissipating substrate MB can be limited. As a result, occurrence of damage such as cracks or deformation in these mounted components MBW, ME, MT, and MW caused by stress due to thermal expansion of the second sealing member MS acting on the mounted components MBW, ME, MT, and MW on the heat dissipating substrate MB can be suppressed.

By suppressing deformation of the terminal MT caused by stress of the second sealing member MS, the dimension accuracy of the terminal MT in addition to the positional accuracy of the terminal MT can be improved.

As described above, the module M according to an aspect of the present invention is a module housed in the housing case H of an electronic component in the power conversion device 100, including the heat dissipating substrate MB including the first surface MA1 and the second surface MA2 on the opposite side of the first surface MA1, the element ME arranged on the first surface MA1 of the heat dissipating substrate MB, the connecting terminal MT arranged on the first surface MA1 of the heat dissipating substrate MB and provided for electrically connecting the element ME to the wiring substrate 10 arranged on the module M, the module case MC arranged on the first surface MA1 in such a manner that the circumference of the heat dissipating substrate MB is partially covered, and the sealing member MS sealing the element ME and the connecting portion of the terminal MT with the element ME.

The heat dissipating substrate MB includes the positioning parts MBC1 and MBC2 for positioning the module M with respect to the housing case H. The positioning parts MBC1 and MBC2 protrude to the outer side of the module case MC.

In this manner, according to the present invention, positioning of the module M with respect to the housing case H can be performed with the reference being the side surface MBS of the positioning parts MBC1 and MBC2 protruding to the outer side of the module case MC. Therefore, the positional accuracy of the connecting terminal MT arranged on the heat dissipating substrate MB can be improved.

Therefore, according to the present invention, the positional accuracy of the connecting terminal MT can be improved.

Second Embodiment

Next, with reference to FIG. 11A and FIG. 11B, a module and a power conversion device according to a second embodiment that regulates the flow direction of the adhesive Ma are described.

FIG. 11A is a sectional view of the power conversion device 100 according to the second embodiment taken along a cross section corresponding to an XIA-XIA cross section in FIG. 10. FIG. 11B is a sectional view of the power conversion device 100 according to the second embodiment taken along a cross section corresponding to an XIB-XIB cross section in FIG. 10.

For prevention of the adhesive Ma adhering on the side surface MBS of the corner portions MBC1 and MBC2 of the heat dissipating substrate MB, the module case MC according to the second embodiment includes a flow-direction regulating part Sin that regulates the flow direction of the adhesive Ma in such a manner that the adhesive Ma flows toward an inner side D2 of the module case MC.

Specifically, as illustrated in FIG. 11A and FIG. 11B, the flow-direction regulating part Sin is the inner periphery Sin of an adhesion surface S of the module case MC for the first surface MA1, being located farther in a surface normal direction n from the first surface MA1 than an outer periphery Sout. As illustrated in FIG. 11A and FIG. 11B, a recessed portion R can be provided toward the surface normal direction n between the outer periphery Sout and the inner periphery Sin of the adhesion surface S, in order to increase the adhesion area for the adhesive Ma.

As described above, the corner portions MBC1 and MBC2 of the heat dissipating substrate MB are used as the positioning parts MBC1 and MBC2 for positioning the module case MC with respect to the housing case H, after assembly of the module M.

In a case where a large amount of the adhesive Ma flows toward the outer side D1 of the module case MC, there is a risk that the positioning of the module M using the corner portions MBC1 and MBC2 is unable to be performed with high accuracy, due to the flowed adhesive Ma adhering on the side surface MBS of the corner portions MBC1 and MBC2. That is, in the case where a large amount of the adhesive Ma flows toward the outer side D1 of the module case MC, there is a risk that highly accurate positioning of the module M using the corner portions MBC1 and MBC2 is unable to be ensured in a stable manner.

On the other hand, according to the second embodiment, the adhesive Ma can be caused to flow toward the inner side D2 of the module case MC by the inner periphery Sin as the flow-direction regulating part. Therefore, adhesion of the adhesive Ma on the side surface MBS of the corner portions MBC1 and MBC2 can be prevented. Accordingly, highly accurate positioning of the module M using the corner portions MBC1 and MBC2 can be ensured in a stable manner.

Further, by forming the flow-direction regulating part with the inner periphery Sin, the flow direction of the adhesive Ma can be regulated to a direction toward the inner side D2 of the module case MC with a simple configuration.

Therefore, according to the second embodiment, highly accurate positioning of the module M using the corner portions MBC1 and MBC2 can be ensured in a stable manner by regulating the flow direction of the adhesive Ma, and thus the positional accuracy of the terminal MT can be further improved in a reliable manner.

Third Embodiment

Next, with reference to FIG. 12, a module and a power conversion device according to a third embodiment are described, where the side surface of the heat dissipating substrate MB different from the side surfaces of the corner portions MBC1 and MBC2 is intentionally exposed. FIG. 12 is a side view of the power conversion device 100 according to the third embodiment as viewed from a direction corresponding to an XIIA direction and an XIIB direction in FIG. 10.

As illustrated in FIG. 12, in the third embodiment, the second side wall portion MCW2a of the module case MC is provided with a second cutout MCN2 causing the side surface MBS of the heat dissipating substrate MB to be partially exposed. The second cutout MCN2 is also provided to the second side wall portion MCW2b.

In a manufacturing process of the module M, the module case MC is temporarily fixed, via the adhesive Ma, onto the heat dissipating substrate MB mounted with the wires MW, the elements ME, the terminals MT, and the bonding wires MBW.

After temporarily fixing the module case MC, the heat dissipating substrate MB is moved to a position on a production line where a forming process (for example, potting) of the second sealing member MS is carried out, in order to seal a portion of the wires MW, the elements ME, the bonding wires MBW, and the terminals MT.

At this time, a jig for movement of the heat dissipating substrate MB can be pressed against the side surface MBS of the heat dissipating substrate MB exposed from the second cutout MCN2. In other words, the side surface MBS of the heat dissipating substrate MB exposed from the second cutout MCN2 can be held in between with the jig.

With this configuration, the heat dissipating substrate MB can be moved in a stable manner up to the position on the production line where the forming process of the second sealing member MS is carried out.

Therefore, according to the third embodiment, the module M can be manufactured in a stable manner with a simple configuration.

The embodiments described above are only examples and do not limit the scope of the invention. Various modifications can be made with respect to the above embodiments without departing from the scope of the invention. Such modified embodiments are also included in the invention described in the appended claims and equivalents thereof.

REFERENCE CHARACTERS

100 power conversion device
H housing case
M module
MA1 first surface
MA2 second surface
MB heat dissipating substrate
MBC1, MBC2 positioning part (corner portion)
ME element
MT terminal
MC module case
MS second sealing member

The invention claimed is:

1. An electronic module arranged in a recessed portion which is provided in a device case, the electronic module comprising:
   a substrate;
   an electronic element mounted on a surface of the substrate;
   a connecting terminal vertically arranged on the surface of the substrate;
   a module case having a frame shape provided on an edge of the surface of the substrate so as to surround the surface of the substrate; and
   a sealing resin which is filled in the module case and seals the electronic element,
   wherein
      the module case causes at least one corner portion of the substrate to protrude to an outer side of the module case, and
      the electronic module is arranged in the recessed portion with the corner portion of the substrate protruded from the module case as a reference for positioning.

2. The electronic module of claim 1, wherein the module case causes a pair of corner portions located on a diagonal line of the substrate to protrude to the outer side of the module case.

3. The electronic module of claim 2, wherein the pair of corner portions of the substrate protruded to the outer side of the module case are chamfered, and chamfered amounts of the corner portions are different from each other.

4. The electronic module of claim 1, wherein the module case has a wall portion which extends diagonally to cause the corner portion of the substrate to protrude to the outer side of the module case.

5. The electric module of claim 1, wherein
the module case comprises an adhesive coating portion, which protrudes to an inward from an inner surface of the module case and a tip portion thereof extends to the surface side of the substrate, and
the module case is adhered to the surface of the substrate via an adhesive applied between the adhesive coating portion and the surface of the substrate.

6. The electric module of claim 1, wherein a cutout is provided at an end of the module case on the substrate side to partially expose a side surface of the substrate.

7. A power conversion device comprising a device case, the electric module of claim 1, and a wiring substrate arranged above the electronic module in the device case.

* * * * *